United States Patent [19]
Marvin et al.

[11] Patent Number: 5,428,319
[45] Date of Patent: Jun. 27, 1995

[54] METHOD AND APPARATUS FOR PROVIDING A MODIFIED TEMPERATURE COMPENSATION SIGNAL IN A TCXO CIRCUIT

[75] Inventors: Dennis F. Marvin, Carol Stream; Daniel J. Russell, Lake Zurich, both of Ill.

[73] Assignee: Motorola, Inc., Schaumburg, Ill.

[21] Appl. No.: 158,548

[22] Filed: Nov. 29, 1993

[51] Int. Cl.[6] .............................................. H03L 1/00
[52] U.S. Cl. ...................................... 331/176; 331/66; 331/116 R
[58] Field of Search .................. 331/176, 66, 158, 44, 331/116 R, 116 FE, 177 R, 179, 177 V

[56] References Cited
U.S. PATENT DOCUMENTS 4,254,382  3/1981  Keller et al. ................. 331/116 R
5,081,431  1/1992  Kubo et al. ................... 331/158

FOREIGN PATENT DOCUMENTS 0278201  12/1986  Japan.

Primary Examiner—Robert J. Pascal
Assistant Examiner—David Vu
Attorney, Agent, or Firm—James A. Coffing

[57] ABSTRACT

A modified temperature compensation signal (110) is provided in a temperature compensated crystal oscillator (TCXO) circuit (100) in the following manner. A temperature dependent current generator (104) produces a temperature compensation signal (108) whose amplitude changes responsive to changes in ambient temperature. The temperature compensation signal (108) is scaled, based on a plurality of discrete frequency adjust values (212), to produce the modified temperature compensation signal (110).

19 Claims, 2 Drawing Sheets

METHOD AND APPARATUS FOR PROVIDING A MODIFIED TEMPERATURE COMPENSATION SIGNAL IN A TCXO CIRCUIT

FIELD OF THE INVENTION

The present invention relates generally to temperature compensated crystal oscillator (TCXO) circuits and, in particular, to a method and apparatus for providing a modified temperature compensation signal in a TCXO circuit.

BACKGROUND OF THE INVENTION

Temperature compensated crystal oscillators (TCXO) circuits are known to comprise an oscillator circuit and a temperature compensation circuit. The oscillator circuit includes a piezoelectric crystal and may be one of a variety of known oscillator topologies, such as Colpitts, Pierce, or Hartley oscillators. Regardless of the chosen oscillator circuit topology, the oscillator circuit ideally generates a very narrowband alternating current (AC) signal at a predetermined center frequency. Thus, the oscillator circuit utilizes the crystal to provide a tuned, resonant circuit with a high quality factor (Q) at the oscillator circuit's operating frequency. The crystal's high Q accommodates the desired narrowband frequency response of the oscillator, a frequency response that cannot be achieved using lower Q, discrete inductors.

As is also known, the crystal is a circuit element whose frequency characteristics are responsive to variations in ambient temperature. For example, the crystal's resonant frequency depends on the physical shape, blank orientation (i.e., cut type, and angle), elasticity constant, and density of the piezoelectric material. Since these characteristics of the piezoelectric material vary during ambient temperature excursions, a corresponding change in the crystal's resonant frequency results.

In an attempt to limit the variation of the crystal's resonant frequency over temperature, crystal cuts are generally selected to provide a substantially flat frequency-versus-temperature response over a desired temperature range. An AT-cut crystal, which has a third order frequency versus temperature characteristic, typically provides a flat frequency versus temperature response over a temperature range of −30° C. to +85° C. when compensated. Similarly, GT-cut crystals might be used to provide a flat frequency versus temperature response over a more limited temperature range (e.g., from −10° C. to +50° C.).

Since the crystal's resonant frequency varies as a function of temperature, the oscillator's output signal frequency also changes as a function of temperature. Over a temperature range of −30° C. to +85° C., the oscillator's output signal frequency may change approximately +/−20 parts per million (ppm) for a typical AT-cut crystal when no compensation has been added to the oscillator. For example, an uncompensated oscillator circuit using an AT-cut crystal with a 10 MHz resonant frequency can be expected to vary in output signal frequency by as much as 200 Hz.

To reduce the oscillator frequency variation, the TCXO utilizes the temperature compensation circuit to correct for frequency deviations due to variations in temperature. Temperature compensation of the oscillator circuit is typically achieved by placing a temperature dependent reactance in series with the crystal. The temperature dependent reactance is selected to cancel the variation in crystal reactance caused by changes in ambient temperature. The temperature dependent reactance typically comprises a varactor diode whose applied voltage is determined by the temperature compensation circuit, depending on the amount of compensation reactance necessary. With this temperature compensation, the oscillator's output signal frequency remains substantially constant over variations in ambient temperature, thus resulting in a substantially flat frequency-versus-temperature response for the oscillator circuit. For example, the output signal frequency variation of the aforementioned 10 MHz oscillator circuit may improve from +/−20 ppm to +/−1 ppm (i.e., 10 Hz) with temperature compensation.

In addition to temperature effects, the crystal's frequency varies over time due to aging. Aging typically results from stress relief in the crystal or mass transfer to, or from, the crystal. To correct for this phenomenon, the oscillator circuit is adjusted to counteract, or offset, the aging. Aging correction is generally accomplished by varying the oscillator's load reactance by a predetermined amount, thus forcing the oscillator circuit to operate at a new load reactance point. Operation into the new load reactance inherently impacts the frequency response of the oscillator circuit, and results in correcting the aged oscillator's output signal frequency. A varactor, variable capacitor, or variable inductor is typically used to provide the aging adjustment. The aging adjustment is substantially independent of the temperature compensation circuit.

By providing the aging adjustment and temperature compensation of the TCXO independently, a result known as the trim effect occurs. Since crystal aging is corrected by changing the oscillator circuit's load reactance (i.e., the load capacitance of the crystal), the temperature compensated oscillator circuit operates into a different load after an aging adjustment. Changes in the crystal's load capacitance affect the crystal's frequency sensitivity and, correspondingly, the amount of compensation provided by the temperature compensation circuit.

The crystal's frequency sensitivity is given by the following equation:

$$\text{crystal sensitivity} = (\omega C_m)/\{2\,[(C_0/C_1)+1]^2\} \times 10^6 \; [\text{ppm/ohm}]$$

where $C_m$ = crystal motional capacitance;
$C_0$ = static capacitance of the crystal;
$C_1$ = load capacitance; and
$\omega$ = angular frequency.

Thus, changes in the crystal's load capacitance ($C_1$) during an aging adjustment disrupts the substantially flat frequency versus temperature response produced by the temperature compensation circuit. This disruption is known as the trim effect. The trim effect is not a serious problem with low stability oscillators (e.g., greater than 5 ppm); however, with the growing demand for high stability oscillators (e.g., 1 ppm or less), the trim effect has a noticeable effect on oscillator stability performance.

Prior art techniques attempt to solve the trim effect dilemma in two distinct manners. The first technique is to neutralize the crystal's static capacitance ($C_0$), thus creating a constant crystal sensitivity as a function of load capacitance. A crystal's static capacitance is typically neutralized by placing an inductor in parallel with the crystal. This technique generally results in an oscillator circuit that is more prone to generating undesirable spurious responses due to the increased number of feedback paths produced within the oscillator circuit by incorporating the parallel inductor. In addition, this technique is impractical for fundamental-mode crystals since unreasonably large inductances are typically required. The second technique is to temperature compensate the oscillator's output signal frequency by using compensation external to the TCXO circuit, such as adding or deleting bits from the output signal waveform. While this compensation technique can provide excellent performance when used in dual mode oscillators, such as those described in U.S. Pat. Nos. 4,160,183 and 4,872,765, it is a fairly complex and expensive procedure that is not suitable for moderately priced products.

Therefore, a need exists for a method and apparatus for reducing the trim effect of a TCXO circuit that is not constrained by the shortcomings of the prior art. In particular, a compensating technique that can be used over a wide range of operating parameters and that uses a desired aging adjust without requiting external compensation circuitry would be an improvement over the prior art.

DESCRIPTION OF A PREFERRED EMBODIMENT

Generally, the present invention encompasses a method and apparatus for providing a modified temperature compensation signal in a temperature compensated crystal oscillator (TCXO) circuit. This is accomplished by using a temperature dependent current generator to provide a temperature compensation signal whose amplitude changes responsive to changes in ambient temperature. The temperature compensation signal is scaled, based on a plurality of discrete frequency adjust values, to produce the modified temperature compensation signal. By producing the modified temperature compensation signal in this manner, trim effect associated with compensating the TCXO circuit is significantly reduced without requiring external compensation circuitry.

Figure 1:
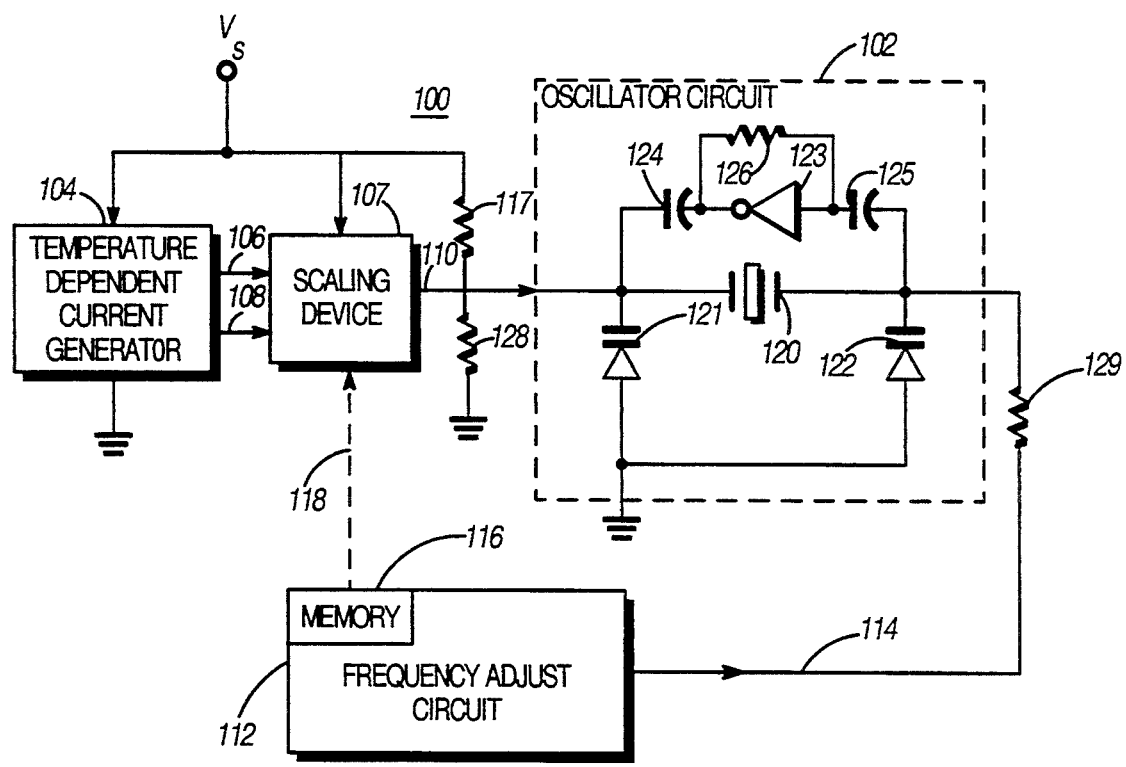
FIG. 1 illustrates a temperature compensated crystal oscillator circuit, in accordance with the present invention.

The present invention can be more fully described with reference to FIGS. 1-3. FIG. 1 illustrates a TCXO circuit 100 that includes an oscillator circuit 102, a temperature dependent current generator 104, a scaling device 107, and a frequency adjust circuit 112, in accordance with the present invention. In a preferred embodiment, the oscillator circuit 102 utilizes the known Pierce topology and includes a piezoelectric device (e.g., a crystal 120), two varactor diodes 121,122, an inverter 123, two coupling capacitors 124, 125, and a feedback resistor 126. The temperature dependent current generator 104 preferably comprises a combination of current mirrors, current sources, and temperature dependent differential amplifiers as detailed in U.S. Pat. No. 4,254,382, entitled "Crystal Oscillator Temperature Compensating Circuit," and assigned to Motorola Inc. The scaling device 107 and the frequency adjust circuit 112 are detailed below.

Modified temperature compensation of the TCXO circuit 100 is provided by the present invention in the following manner. A direct current (DC) supply voltage ($V_s$) provides DC power to the temperature dependent current generator 104 and the scaling device 107. In a manner described in U.S. Pat. No. 4,254,382, fully incorporated by reference thereto as though fully set forth herein, the temperature dependent current generator 104 produces a current source/sink reference voltage 106 and a temperature compensation signal 108, which am subsequently delivered to the scaling device 107. The temperature compensation signal 108 is preferably a current whose amplitude changes responsive to ambient temperature variations. However, in an alternate embodiment, the temperature compensation signal 108 may be a temperature dependent voltage. The choice of temperature compensation signal 108 depends on the composition of the scaling device 107. For the remainder of this discussion, it is assumed that the temperature compensation signal 108 is a DC current.

The scaling device 107 scales the temperature compensation signal 108, responsive to discrete frequency adjust values stored in a memory 116 of the frequency adjust circuit 112, to produce the modified temperature compensation signal 110. The discrete frequency adjust values, which may comprise aging correction values or frequency offset values, are conveyed to the scaling device via a control arrangement 118 that is described in detail below.

Upon exiting the scaling device 107, the modified temperature compensation signal 110 is preferably convened to a bias voltage by applying the modified temperature compensation signal 110 to two resistors 117, 128 located at the input to the oscillator circuit 102. The bias voltage developed across resistor 128 is applied to varactor diode 121 to produce a temperature dependent reactance (i.e., the reactance of varactor diode 121 varies in response to the applied temperature dependent voltage). In a preferred embodiment, the amount of reactance change provided by varactor diode 121 in response to its applied bias voltage is large enough to correct the temperature dependent frequency response of the crystal 120 and the temperature dependent reactances of the varactor diodes 121, 122. Thus, by applying the bias voltage to varactor diode 121, the oscillator frequency remains substantially constant over changes in ambient temperature.

In addition to receiving the modified temperature compensation signal 110, the oscillator circuit also receives a trim adjust signal 114 from the frequency adjust circuit 112. The trim adjust signal 114 is a voltage produced by the frequency adjust circuit 112 independent of the ambient temperature and in response to the discrete frequency adjust values resident in memory 116. In a preferred embodiment, the trim adjust signal 114 is applied to varactor diode 122 via resistor 129. The trim adjust signal 114 varies the reactance of varactor diode 122 responsive to changes in the discrete frequency adjust values. Therefore, since varactor diode 122 provides a capacitive load to the crystal 120, variation of the trim adjust signal 114 results in a temperature independent variation of the crystal's load reactance. This load reactance change alters the crystal's frequency sensitivity in response to a particular aging factor or a desired frequency offset.

Upon receiving the modified temperature compensation signal 110 and the trim adjust signal 114, the oscillator circuit 102 generates an alternating current signal at a frequency dependent upon both signals 110, 114. Operation of the oscillator circuit 102 is well known in the art, thus no further discussion will be presented except to facilitate an understanding of the present invention. By incorporating an aging dependence on the modified temperature compensation signal 110, the present invention allows for continuous frequency correction of the oscillator output signal to simultaneously account for the effects of aging and ambient temperature variations. Thus, the present invention solves the trim effect dilemma of the prior art by adjusting the oscillator circuit's signal frequency in a single compensation step that takes into account the collective effects of aging and ambient temperature variation, while requiring substantially less circuit area than existing trim effect compensation circuitry.

Figure 2:
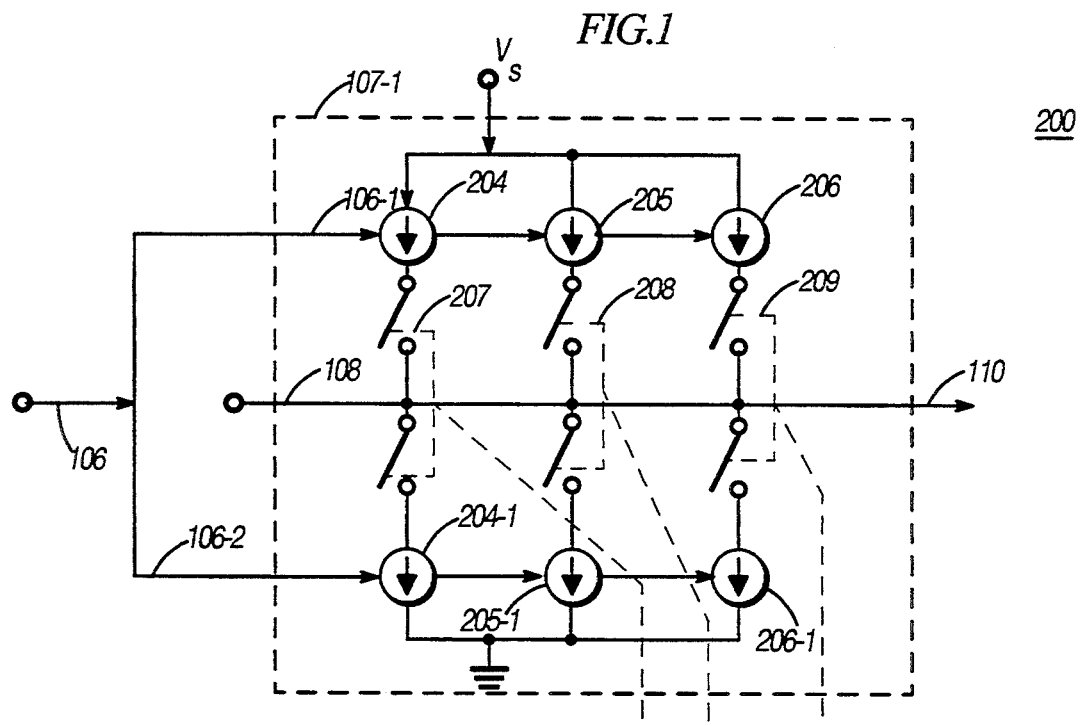
FIG. 2 illustrates a scaling device and control arrangement, in accordance with the present invention.

FIG. 2 illustrates preferred embodiments of the scaling device 107, the frequency adjust circuit 112, and the control arrangement 118, in accordance with the present invention. The preferred scaling device comprises a partitioned current mirror 107-1 that includes a plurality of current mirroring devices (three shown). The plurality of current mirroring devices comprises a plurality of current sources 204–206 and a plurality of current sinks 204-1–206-1. Each current source 204–206 is substantially identical to its respective current sink 204-1–206-1. The control arrangement 118 comprises a plurality of digital switches 207–209 that are used to activate the plurality of current mirroring devices based on a selected portion of discrete frequency adjust values ($A_0$–$A_n$) 212 residing in the memory 116 of the frequency adjust circuit 112. The frequency adjust circuit 112 preferably includes an eight bit latch register 211 for storing the discrete frequency adjust values 212, and a frequency adjust digital-to-analog converter (DAC) 213 for providing the trim adjust signal 114.

When the temperature compensation signal 108 and the current source/sink reference voltage 106 enter the partitioned current mirror 107-1, the current source/sink reference voltage 106 is comprised of a current source component 106-1 and a current sink component 106-2. The current source component 106-1 is applied as a reference voltage to the partitioned current mirror's current sources 204–206. Similarly, the current sink component 106-2 is applied as a reference voltage to the partitioned current mirror's current sinks 204-1–206-1.

When actuated via their respective digital switches 207–209, each current source 204–206 supplies a current proportional to the current supplied by an output current source residing in the temperature dependent current generator 104. For example, in a preferred embodiment, when a typical AT-cut crystal has a maximum uncompensated frequency versus temperature deviation of +/−20 ppm and an anticipated aging offset of +/−10 ppm, the current sources 204–206 may be chosen to source 0.57%, 1.14%, and 2.28%, respectively, of the total current sourced by the temperature dependent current generator's output current source. In a similar manner, each current sink 204-1–206-1 sinks a current proportional to the current sunk by an output current sink residing in the temperature dependent current generator 104. The proportion of current sourced by each current source 204–206 and sunk by each current sink 204-1–206-1 depends on the amount of acceptable trim effect for an anticipated aging offset and crystal frequency temperature compensation.

The temperature compensation signal 108 is modified as it passes through the partitioned current mirror 107-1 by the opening and closing of the digital switches 207–209 that comprise the control arrangement 118. As briefly mentioned above, actuation of the digital switches 207–209 is dependent upon the discrete frequency adjust values 212 stored in the memory 116 of the frequency adjust circuit 112. In the preferred embodiment, switch actuation is only dependent upon the three most significant bits (i.e., $A_n$–$A_{n-2}$) in the eight bit latch register 211. Therefore, when the three most significant bits are all binary zeroes, all three digital switches 207–209 are open and the temperature compensation signal 108 passes through the partitioned current mirror without being modified. This results in a modified temperature compensation signal 110 that is at its minimum value and is substantially equivalent to the temperature compensation signal 108. On the other hand, when the three most significant bits are all binary ones, all three digital switches 207–209 are closed and the temperature compensation signal 108 is modified by all three current mirroring devices. This results in a modified temperature compensation signal 110 that is at its maximum value. Thus, by using the three most significant bits, eight switch combinations (i.e., $2^3$) may be realized, each facilitating a 0.11 ppm change in the oscillator circuit's signal frequency based on the current source/sink proportions provided in the above example.

To provide a substantially symmetric range for varying the modified temperature compensation signal 110 about a predetermined center value, the three most significant bits may initially comprise a binary zero, a binary one, and a binary one, respectively. This bit arrangement closes digital switches 208 and 209, thus producing a modified temperature compensation signal 110 that is equivalent to the temperature compensation signal 108 summed with the currents produced by current sources 205 and 206. In the preferred embodiment, the other seven possible values of the three most significant bits permit the modified temperature compensation signal 110 to vary +/−2% from its nominal, or center, value.

Similar to the partitioned current mirror 107-1, the frequency adjust DAC 213 generates the trim adjust signal 114 (e.g., a DC voltage) responsive to the discrete frequency adjust values 212 in the eight bit latch register 211. Thus, the discrete frequency adjust values 212 impact the modified temperature compensation signal 110 and the trim adjust signal 114 simultaneously. In a preferred embodiment, the trim adjust signal 114 is a quantized analog version of the discrete frequency adjust values 212 resident in the eight bit latch register 211. As mentioned above, the trim adjust signal 114 is used to vary one of the two crystal load reactances (i.e., varactor diode 122) in response to anticipated crystal aging or a desired oscillator frequency offset. The other crystal load reactance (i.e., varactor diode 121) is adjusted by the voltage converted, modified temperature compensation signal 110 in response to aging, or frequency offset, and ambient temperature variation.

Figure 3:
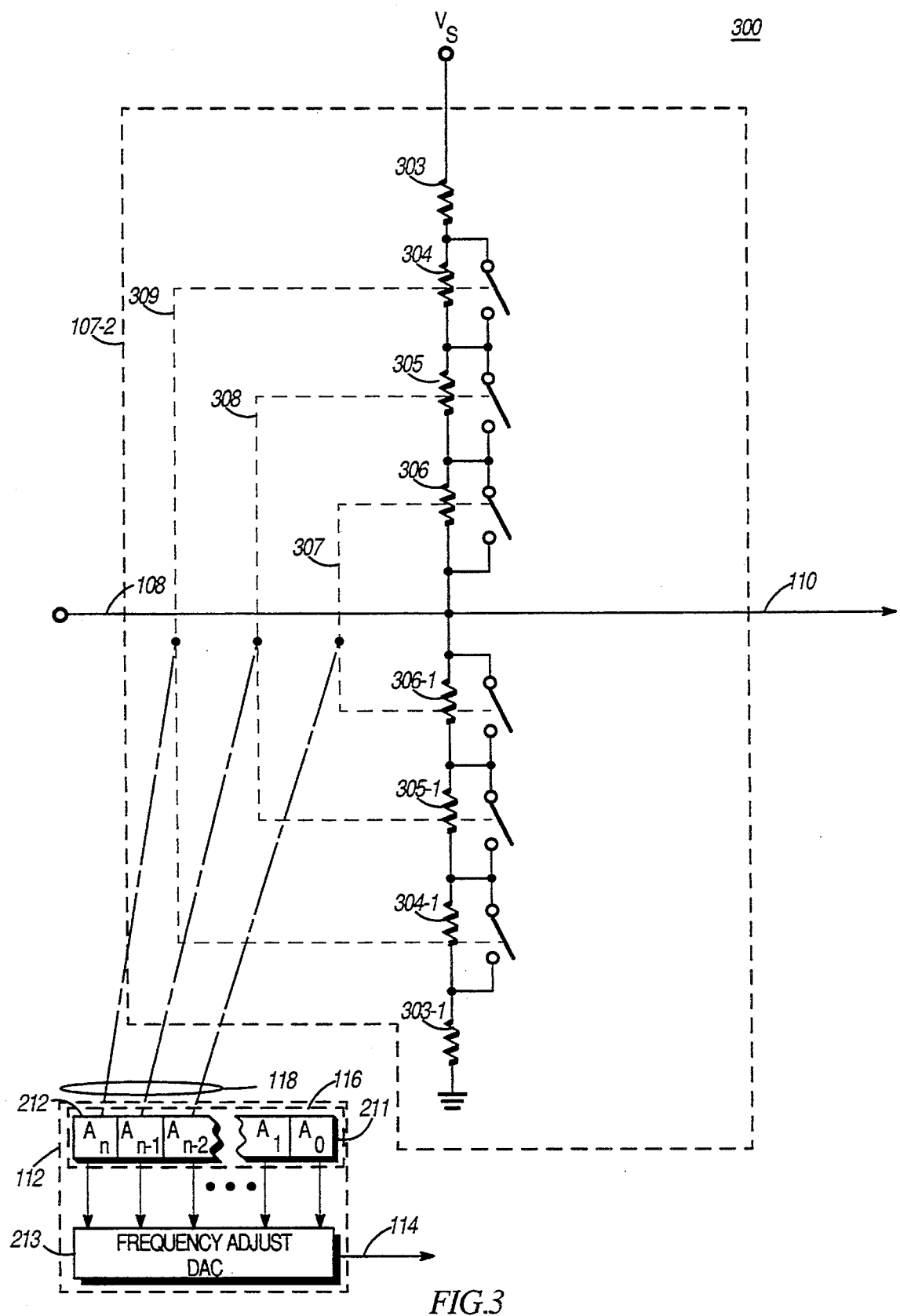
FIG. 3 illustrates an alternate scaling device and control arrangement, in accordance with the present invention.

FIG. 3 illustrates an alternate embodiment of the scaling device 107, in accordance with the present invention. The alternate scaling device 107 comprises a partitioned resistance device 107-2 that includes a plurality of resistive devices 304–306, 304-1–306-1 (six shown). Each pair of corresponding resistive devices (e.g., 304 and 304-1) preferably has substantially identical resistances. The resistance devices of each pair are symmetrically located about a node that receives the temperature compensation signal 108 and provides the modified temperature compensation signal 110. The plurality of resistance devices 304–306, 304-1–306-1 preferably comprise resistors and may be serially connected between the supply voltage and ground, as shown. It should be noted that in this embodiment, resistors 117 and 128 of FIG. 1 are unnecessary since their functionality is inherently performed by resistors 303 and 303-1 in the partitioned resistance device 107-2. It should be further noted that the current source/sink reference voltage 106 provided in FIGS. 1 and 2 is preferably not used in the partitioned resistance device 107-2.

When the temperature compensation signal 108 enters the partitioned resistance device 107-2, it is modified by the opening and closing of digital switches 307–309 that comprise the control arrangement 118. Similar to the discussion with reference to FIG. 2, actuation of the digital switches 307–309 is preferably dependent upon the values 212 of the three most significant bits in the eight bit latch register 211. As each switch 307–309 is actuated, the effective resistance between the voltage supply and the node that receives the temperature compensation signal 108 is decreased. Accordingly, the voltage variation at the node decreases by an amount proportional to the effective resistance provided by the resistance devices 304–306, 304-1–306-1. Thus, the modified temperature compensation signal 110 is dependent upon the temperature compensation signal 108 and the values 212 of the three most significant bits in the eight bit latch register 211. Similar to the above discussion with regard to the partitioned current mirror 107-1 of FIG. 2, the partitioned resistance device 107-2 may be initially configured with switches 308 and 309 closed to provide a predetermined nominal voltage for the modified temperature compensation signal 110.

It should also be noted that although the above discussion with regard to FIG. 3 is based on a temperature compensation signal 108 being comprised of a DC current, it is also adaptable to an analog voltage. The analog voltage (e.g., a DC voltage) might be supplied from a microprocessor-based DAC that converts the output current of the temperature dependent current generator 104 to a voltage prior to applying the temperature compensation signal 108 to the scaling device 107. In this case, the scaling device 107 may comprise the partitioned resistance device 107-2 in a voltage divider configuration, or a programmable voltage scaling element, such as an operational amplifier.

The present invention provides a method and apparatus for providing a modified temperature compensation signal in a TCXO circuit. With this invention, aging and temperature compensation of the oscillator circuit are performed simultaneously, without the use of circuitry external to the TCXO circuit, to reduce the trim effect. Thus, the present invention facilitates the cost effective production of high stability TCXO circuits, a benefit that is not readily attainable with the large, costly external circuitry resident in prior art trim effect reduction techniques. Further, the TCXO circuit of the present invention requires only an initial determination of the frequency adjust values to set and maintain the oscillation frequency for a particular crystal oscillator. Accordingly, the instant invention maintains temperature compensated performance of the oscillator circuit in response to crystal aging, or frequency offset, adjustments, as compared to the degradation of oscillator temperature compensated performance produced responsive to such adjustments in prior art TCXO circuits.

What is claimed is:

1. In a temperature compensated crystal oscillator (TCXO) circuit that includes an oscillator for generating a signal whose frequency changes responsive to a temperature compensation signal, the oscillator including a piezoelectric device whose frequency characteristics change responsive to changes in ambient temperature, a method for modifying the temperature compensation signal to offset a trim effect caused by a variation in load capacitance of the piezoelectric device, the method comprising the steps of:
   A) providing a temperature compensation signal whose amplitude changes responsive to changes in the ambient temperature;
   B) providing a plurality of discrete frequency adjust values; and
   C) scaling the temperature compensation signal, responsive to the plurality of discrete frequency adjust values to produce a modified temperature compensation signal that offsets the trim effect.

2. The method of claim 1, wherein step (A) comprises the step of providing a temperature dependent current signal representative of a temperature to current conversion.

3. The method of claim 1, wherein step (A) comprises the step of providing a temperature dependent voltage signal representative of a temperature to voltage conversion.

4. The method of claim 1, wherein step (B) comprises the step of storing a plurality of aging correction values to produce the plurality of discrete frequency adjust values, the method further comprising the steps of:
   D) providing a trim signal based, at least in part, on the plurality of aging correction values; and
   E) inputting the trim signal to the TCXO circuit.

5. The method of claim 1, wherein step (B) comprises the step of storing a plurality of frequency offset values to produce the plurality of discrete frequency adjust values the method further comprising the steps of:
   D) providing a trim signal based, at least in part, on the plurality of aging correction values; and
   E) inputting the trim signal to the TCXO circuit.

6. The method of claim 1, wherein the TCXO circuit includes a plurality of resistive devices, and wherein step (C) comprises the step of selecting at least a first of the plurality of resistive devices, responsive to the plurality of discrete frequency adjust values, to produce the modified temperature compensation signal.

7. The method of claim 2, wherein the TCXO circuit includes a plurality of current mirroring devices, and wherein step (C) comprises the step of selecting at least a first of the plurality of current mirroring devices, responsive to the plurality of discrete frequency adjust values, to produce the modified temperature compensation signal.

8. A temperature compensated crystal oscillator (TCXO) circuit, comprising:
   an oscillator circuit that includes a piezoelectric device whose frequency characteristics change responsive to changes in ambient temperature, the oscillator circuit generating a signal whose frequency changes responsive, at least in part, to a modified temperature compensation signal;

a current generator that provides current levels responsive to changes in the ambient temperature to produce a temperature compensation signal;

a partitioned current mirror, operably coupled to the current generator and the oscillator circuit, that includes a plurality of current mirroring devices, wherein the plurality of current mirroring devices provide current levels proportional to the current levels produced by the current generator;

memory means for storing discrete frequency adjust values; and control means, operably coupled between the memory means and the partitioned current mirror, for selecting at least a first of the plurality of current mirroring devices based on the discrete frequency adjust values to modify the temperature compensation signal.

9. The TCXO circuit of claim 8, wherein the memory means comprises an eight bit latch register and the discrete frequency adjust values reside in three most significant bits of the eight bit latch register.

10. The TCXO circuit of claim 9, wherein the control means comprises a plurality of digital switches.

11. The TCXO circuit of claim 8, wherein the discrete frequency adjust values comprise a plurality of aging correction values.

12. The TCXO circuit of claim 8, wherein the discrete frequency adjust values comprise a plurality of frequency offset values.

13. The TCXO circuit of claim 8, wherein each of the plurality of current mirroring devices comprises a current source and a current sink, wherein the current source and the current sink provide current levels that are proportional to the current levels produced by the current generator.

14. A temperature compensated crystal oscillator (TCXO) circuit comprising:

an oscillator circuit that includes a piezoelectric device whose frequency characteristics change responsive to changes in ambient temperature, the oscillator circuit generating a signal whose frequency chariots responsive, at least in part, to a modified temperature compensation signal;

a current generator that provides current levels responsive to changes in the ambient temperature to produce a temperature compensation signal;

a partitioned resistance device, operably coupled to the current generator, that includes a plurality of resistive devices:

memory means for storing discrete frequency adjust values signal means, operably coupled to the memory means, for providing a trim signal to the oscillator circuit; and control means, operably coupled between the memory means and the partitioned resistance device, for selecting at least a first of the plurality of resistive devices based on the discrete frequency adjust values to produce the modified temperature compensation signal.

15. The TCXO circuit of claim 14, wherein the memory means comprises an eight bit latch register and the discrete frequency adjust values reside in three most significant bits of the eight bit latch register.

16. The TCXO circuit of claim 15, wherein the control means comprises a plurality of digital switches.

17. The TCXO circuit of claim 14, wherein the discrete frequency adjust values comprise a plurality of aging correction values.

18. The TCXO circuit of claim 14, wherein the discrete frequency adjust values comprise a plurality of frequency offset values.

19. The TCXO circuit of claim 14, wherein the plurality of resistive devices comprise resistors.

* * * * *